United States Patent [19]
Kehler, Jr.

[11] Patent Number: 4,991,227
[45] Date of Patent: Feb. 5, 1991

[54] SQUELCH CIRCUIT WITH VARIABLE SQUELCH TAIL AND VARIABLE HYSTERESIS

[75] Inventor: Walter H. Kehler, Jr., Sunrise, Fla.

[73] Assignee: Motorola, Inc., Schaumburg, Ill.

[21] Appl. No.: 141,853

[22] Filed: Jan. 11, 1988

[51] Int. Cl.$^5$ ............................................... H04B 1/10
[52] U.S. Cl. ..................................... 455/221; 455/220; 455/225
[58] Field of Search ............... 455/221, 218, 220, 225, 455/222, 223, 303

[56] References Cited

U.S. PATENT DOCUMENTS

| | | | |
|---|---|---|---|
| 4,132,953 | 1/1979 | Martin, III | 455/218 |
| 4,388,731 | 6/1983 | King | 455/221 |
| 4,637,066 | 1/1987 | Kennedy et al. | 455/223 |

OTHER PUBLICATIONS

"Syntor X Instruction Manual"; Motorola, Inc.; Published 10/2/81; Chapter 'Receiver', Sections 2.4 and 2.5 plus schematic diagram.
"Nucleus I.C."; Ed Clark, John Fuerst and Jim Kimball; unpublished, but describes a product on sale in the U.S. in 1979; pp. 88-105 only.

Primary Examiner—Douglas W. Olms
Assistant Examiner—Ralph E. Smith
Attorney, Agent, or Firm—Pablo Meles

[57] ABSTRACT

The period of time that the squelch circuit maintains a radio receiver's audio amplifier active after the signal strength of a received carrier fades below a threshold level is inversely proportional to the strength of the received carrier immediately before the fade. This threshold level is also variable. If, immediately before the fade, the received signal strength exceeds a predetermined trigger level (Vtrg) the threshold level is raised. A buffer amplifier (102) charges a capacitor (C) to a voltage which is proportional to the strength of a received carrier. If the carrier fades below a threshold (Vth2 or Vth3), the buffer is disabled and the capacitor slowly discharges through a resistor (R). When the voltage at the capacitor crosses a reference voltage (Vref1) the output of a comparator (104) switches, thereby deactivating the receiver's audio amplifier. If the voltage at the buffer output is within a specified range, a feedback control circuit (112) switches a variable hysteresis feedback circuit (110) such that the negative-going threshold of the comparator (106) is switched from one threshold level (Vth2) to another (Vth3).

5 Claims, 4 Drawing Sheets

SQUELCH CIRCUIT WITH VARIABLE SQUELCH TAIL AND VARIABLE HYSTERESIS

BACKGROUND OF THE INVENTION

This invention pertains to audio squelch circuits of the type used in radio frequency receivers and, more particularly, to a squelch circuit that adapts its operating parameters as a function of the signal strength of the received radio frequency signal.

In the absence of a radio frequency carrier, a radio receiver will receive and amplify the background noise on the channel, resulting in an objectionable sound at the receiver's speaker. Therefore, in the reception of voice transmissions, radio receivers are usually equipped with a "squelch circuit" to disable the receiver's audio amplifier at the end of a transmission. Since the squelch and audio amplifier circuits do not respond instantaneously, there will be a brief period of time between the end of the transmission and the deactivation of the audio amplifier. During this period of time, which is commonly referred to as "squelch tail", the audio amplifier is active, and the user hears a short burst of noise at the end of every transmission.

A prior art squelch circuit typically deactivates or "squelches" the audio amplifier when the strength of a received radio signal drops below a predetermined threshold voltage, and reactivates or "unsquelches" the audio amplifier when the signal strength exceeds this predetermined threshold. Unfortunately, if the received signal momentarily fades, the audio amplifier may be prematurely disabled. When the signal strength increases after the momentary fade, a significant portion of the transmission may be missed because it requires a finite period of time to detect an increase in signal strength and to reactivate the audio amplifier.

Accordingly, the invention described below maintains the audio amplifier active for a variable period of time after the strength of the received signal drops below a predetermined threshold. This variable time is a function of the strength of the received signal immediately before it fades; the lower the signal strength, the longer the period of time the audio amplifier is activated. The invention also dynamically adjusts the threshold level at which the signal strength must drop below before the audio amplifier can be disabled.

SUMMARY OF THE INVENTION

Briefly, the invention is a squelch circuit for a radio receiver. The input of a buffer is for connection to a squelch input signal, wherein the magnitude of the squelch input signal is indicative of the signal strength of a received radio signal. The signal at the output of the buffer is a voltage that is proportional to the squelch input signal when the buffer is enabled. When the buffer is disabled, its output is in a high impedance mode. A capacitor is coupled to the output of the buffer, and means are provided to discharge the capacitor when the buffer is disabled. A first input of a first comparator is coupled to the output of the buffer. A first input of a second comparator is coupled to the input of the buffer. The output of the second comparator switches from a first state to a second state when the squelch input signal crosses a first predetermined threshold. The output of the second comparator is coupled to an enable input of the buffer, such that the buffer is enabled when the output of the comparator is in the second state. Reference voltage means establish a first reference voltage at a second input of the first comparator when the output of the second comparator is in the first state, and a second reference voltage is established at the second input of the first comparator when the output of the second comparator is in the second state.

In another embodiment of the squelch circuit, a first input of a comparator is for connection to a squelch input signal as described above. A hysteresis feedback circuit is coupled between the output and a second input of the comparator. Means are provided for varying the feedback of the hysteresis feedback circuit, such that the comparator has a first predetermined hysteresis if the squelch input signal is below a predetermined trigger level, and a second predetermined hysteresis if the squelch input signal is above the predetermined trigger level.

DESCRIPTION OF THE PREFERRED EMBODIMENT

Block Diagram and Circuit Operation

Figure 1:
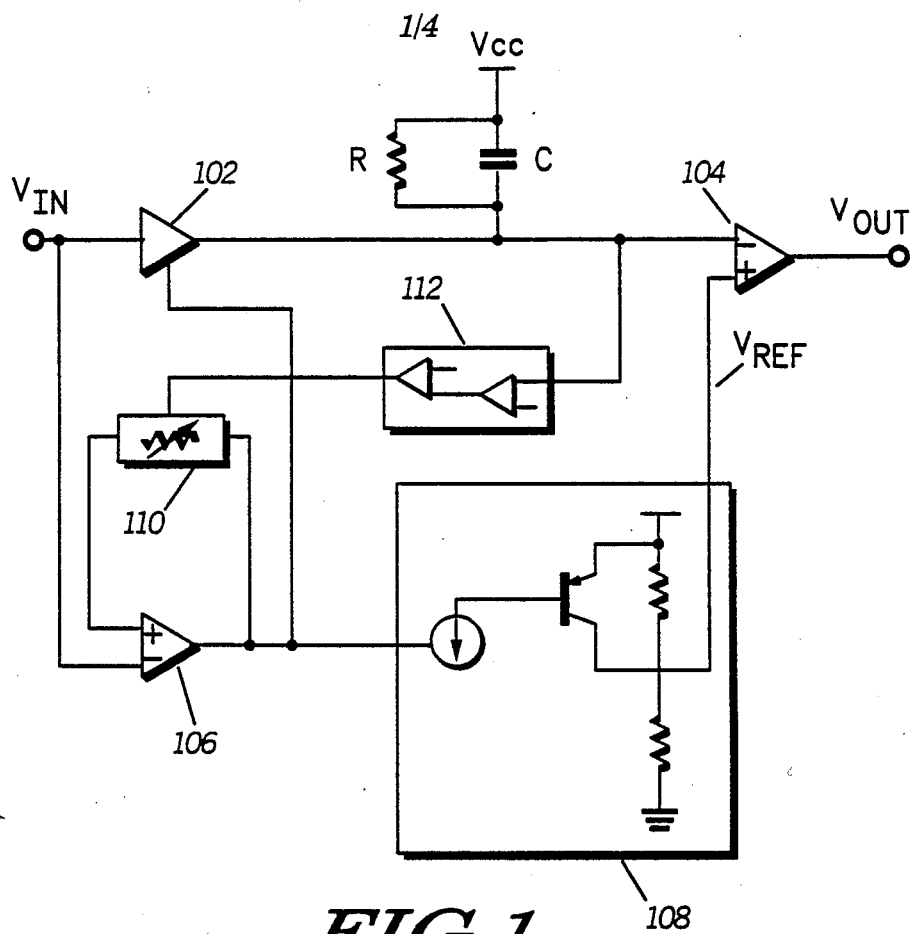
FIG. 1 is a block diagram of the present invention.
Figure 2:
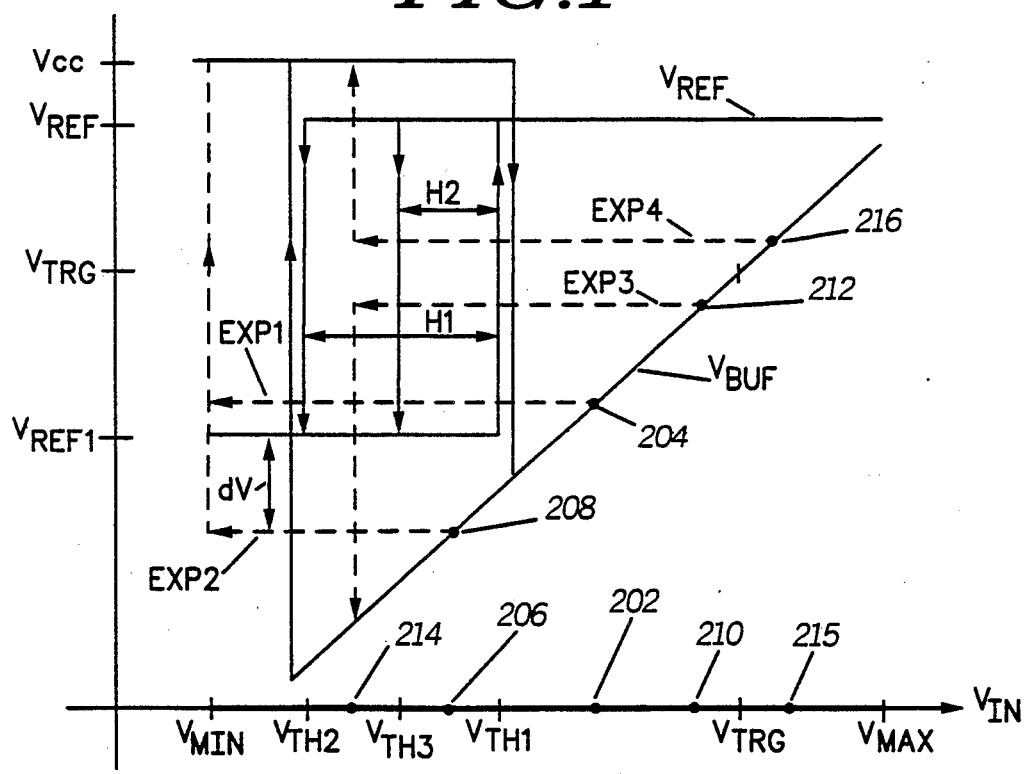
FIG. 2 is a graph of the buffer output voltage and the reference voltage versus the squelch input signal voltage.

A block diagram of the present invention is illustrated in FIG. 1, and the operation of the invention is illustrated in FIG. 2. Referring to these figures, a squelch input signal Vin is connected to the input of a buffer amplifier 102. In an FM radio, the squelch input signal Vin is typically derived from the output of the receiver's discriminator. High pass filter, limiter and rectifier stages are usually coupled between the discriminator output and the input of buffer 102 to produce the squelch input signal Vin at the buffer input. The magnitude of the squelch input signal Vin is indicative of the signal strength of a received radio signal.

Buffer 102 is preferably a differential amplifier connected as a unity voltage gain stage. Buffer 102 can be enabled or disabled, and, when enabled, the buffer output Vbuf is a voltage which is proportional to the squelch input signal Vin. When disabled, the buffer output is in a high impedance mode. When buffer 102 is enabled, capacitor C will charge to the buffer output voltage Vbuf through the small output impedance of the enabled buffer. When buffer 102 is disabled, resistor R provides a means to discharge capacitor C, and the voltage Vbuf will exponentially discharge to the power supply voltage Vcc. The buffer output is also connected to the inverting input of a first comparator 104.

When the squelch input signal exceeds a first predetermined threshold voltage Vth1, the output of a second comparator 106 switches from a first state to a second state (in FIG. 1, the first state is a high or logic 1, and the second state is a low or logic zero). The first state indicates that no R.F. carrier is presently being received, while the second state indicates the presence of a carrier. The output of comparator 106 is coupled to an enable input of buffer 102, such that the buffer is enabled when the comparator output is in the second state. Reference voltage means 108 establish a first reference voltage Vref1 at the non-inverting input of comparator 104 when the output of comparator 106 is in the first state, and a second reference voltage Vref2 when comparator 106 is in the second state.

A variable hysteresis feedback circuit 110 causes the output of comparator 106 to switch from the second to the first state when the squelch input signal Vin drops below a second predetermined threshold Vth2 if a first predetermined hysteresis H1 is selected, and the output of the comparator switches from the second to the first state when Vin drops below a third predetermined threshold Vth3 if a second predetermined hysteresis is selected. A pair of cascaded voltage comparators provide a means 112 for varying the feedback of hysteresis feedback circuit 110. When means 112 detects that the squelch input signal Vin (which is proportional to Vbuf when the buffer is enabled) is below a predetermined trigger voltage Vtrg, the first hysteresis H1 is selected. When Vin is above trigger voltage Vtrg, the second hysteresis is selected.

The operation of the circuit will now be described by way of four examples, EXP1-EXP4.

Example EXP1 assumes that the received carrier is initially of sufficient strength to cause the squelch input signal Vin to be a point 202. With Vin at point 202, the output of comparator 106 enables buffer 102 and selects reference voltage Vref2. With buffer 102 enabled, the buffer output voltage Vbuf will be at point 204. Since Vref2 is greater than the voltage at point 204, the output of comparator 104 will be high and the receiver's audio amplifier will be unsquelched (activated).

Next, we assume that the received carrier abruptly disappears, such that the squelch input signal Vin drops to Vmin. When Vin drops to Vmin, the output of comparator 106 disables buffer 102 and selects reference voltage Vref1. Although Buffer 102 is disabled, capacitor C momentarily holds the voltage that was present at the buffer output just before the carrier disappears, i.e., the voltage at point 204. But this voltage is greater than Vref1 and, consequently, the output of comparator 104 abruptly changes, squelching (deactivating) the receiver's audio amplifier almost immediately after the carrier disappears. This results in a very short squelch tail.

Example EXP2 assumes that the received carrier is initially of sufficient strength to cause the squelch input signal Vin to be at point 206. Example EXP2 also assumes that buffer 102 is presently enabled and that reference voltage Vref2 is initially selected. With buffer 102 enabled, the buffer output voltage Vbuf will be at point 208 and the receiver's audio amplifier will be unsquelched by comparator 104 because Vref2 is greater than the voltage at point 208.

Next, we assume that the received carrier abruptly disappears. As before, the output of comparator 106 switches such that buffer 102 is disabled and reference voltage Vref1 is selected. Capacitor C momentarily holds the voltage Vbuf that was present at the output of the buffer just before the received carrier disappeared, i.e., the voltage at point 208. Contrary to the first example, the voltage at the capacitor (Vbuf) is lower than Vref1 and, consequently, the output of comparator 104 does not change immediately and the receiver's audio amplifier is, for the moment, unsquelched. The difference between Vbuf (at point 208) and Vref1 is illustrated in FIG. 2 as dV.

When buffer 102 is disabled, its output is in a high impedance mode and resistor R begins to discharge capacitor C such that Vbuf (i.e., the voltage at capacitor C) begins to rise exponentially in time towards Vcc. When Vbuf crosses Vref1, the output of comparator 104 switches, squelching the receiver's audio amplifier. This results in a very long squelch tail.

A close examination of FIG. 2 reveals that the lower the strength of the received carrier immediately before it disappears or, simply fades, the greater dV will be and the longer the squelch tail. Thus, for buffer output voltages Vbuf less than Vref1, the length of the squelch tail is dependent upon the time constant of the resistor/capacitor combination and the voltage dV.

Examples EXP3 and EXP4 illustrate the variable hysteresis features of the invention. In example EXP3, the signal strength of a received carrier is of sufficient strength to cause the squelch input signal Vin to be at point 210. Buffer 102 is enabled, Vref2 is selected, and comparator 104 unsquelches the receiver's audio amplifier. With buffer 102 enabled, its output will be at point 212. But the voltage at point 212 is below the trigger voltage Vtrg of the feedback control circuit 112 and, consequently, hysteresis H1 is selected.

Next, if the strength of the carrier were to fade such that Vin was at point 214, the output of comparator 106 would not change because Vin must drop below Vth2 when H1 is selected. Thus, the receiver's audio amplifier remains unsquelched.

In example EXP4, the received carrier is of sufficient strength to cause Vin to be at point 215, which causes Vbuf to be at point 216. Since the voltage at point 216 is greater than Vtrg, feedback control circuit 112 selects hysteresis H2. Consequently, if the carrier fades abruptly such that Vin is at point 214, the output of comparator 106 changes state causing Vref1 to be selected. Since the voltage at point 216 is greater than Vref1, comparator 104 changes state and squelches the receiver's audio amplifier.

Thus, the feedback control circuit 112 and the hysteresis feedback circuit 110 function to provide the invention with variable hysteresis. In particular, a first hysteresis is selected if the squelch input signal is below a predetermined trigger voltage immediately before a fade in received signal strength, and a second hysteresis is selected if the squelch input signal is above the trigger voltage immediately before the fade.

It is important to understand that these examples, in particular examples EXP3 and EXP4, do not necessarily demonstrate the advantages of variable hysteresis. There are two primary reasons for using variable hysteresis. First, the signal at Vin can not change instantaneously, but typically has a time constant of 10-15 msec. Therefore, if the received carrier signal were to abruptly disappear, Vin would not instantaneously drop to Vmin, but would take a finite period of time to drop to Vth3. But Vin would take a longer period of time to drop to Vth2; therefore, the squelch tail will be shorter if comparator 106 switches at Vth3, which occurs when hysteresis H2 is selected.

Second, at threshold squelch settings (Vin is usually regulated by a potentiometer which can be varied to adjust the sensitivity of the squelch circuit. When this potentiometer is adjusted such that the background noise level at Vin is just below threshold Vth1, the squelch is said to be set "at threshold") a large amount of hysteresis will result in a longer squelch tail because comparator 106 must wait for a noise spike of sufficient magnitude to drive Vin below threshold Vth2, before the output of the comparator can switch to the first state (the squelched state). Thus, the length of the squelch tail will depend on the occurrence of a random noise spike. Therefore, by switching the hysteresis to the smaller value H2, the squelch tail is shortened because the average background noise is sufficient to drive Vin below Vth3.

Detailed Schematic

Figure 3A:
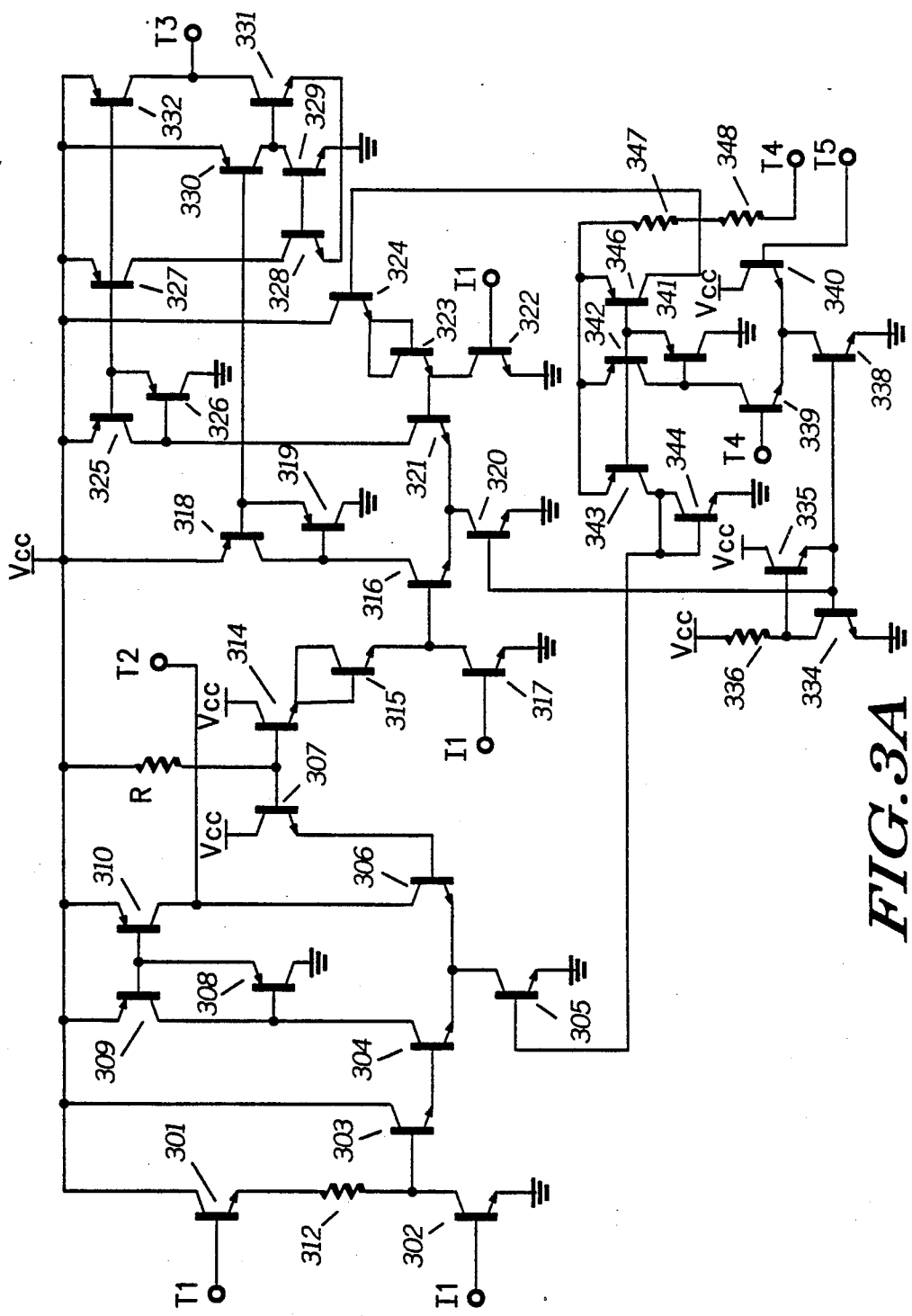
FIGS. 3A–3C are detailed schematic drawings of the present invention
Figure 3B:
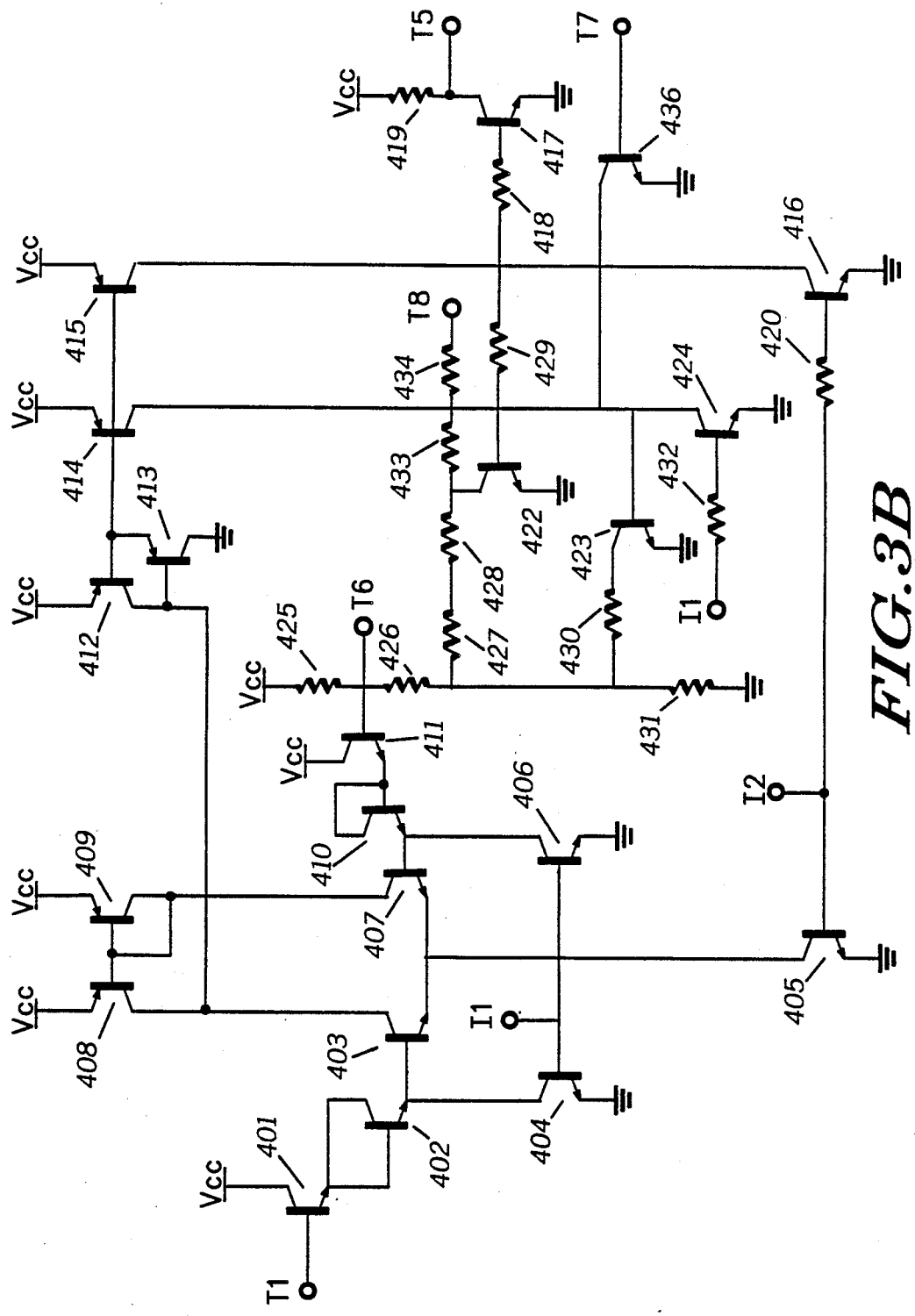
Figure 3C:
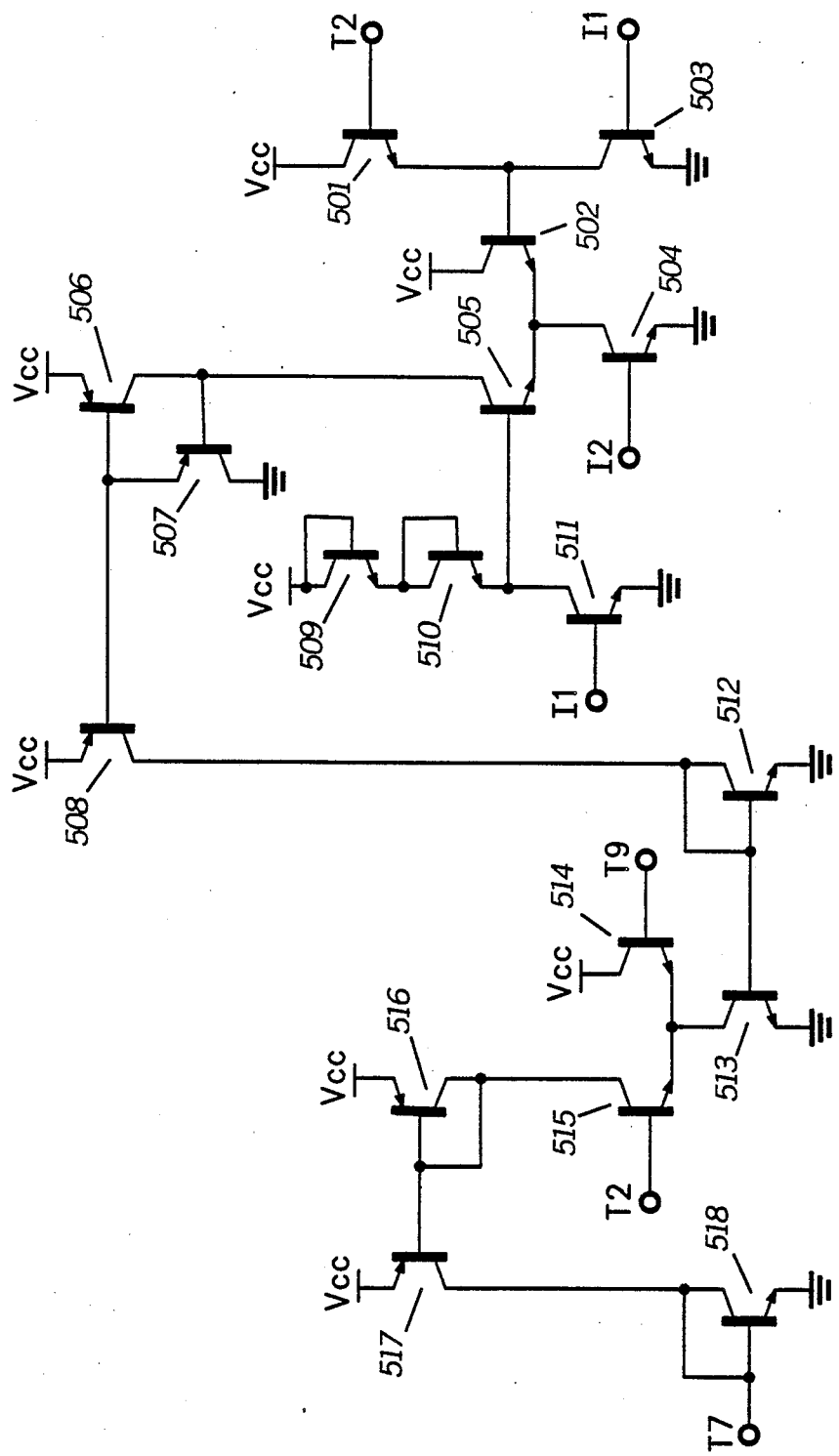

In FIGS. 3A-3C, a detailed schematic diagram of the invention is illustrated. The invention is preferably constructed as an integrated circuit using well known bipolar integrated circuit technology.

Referring to FIG. 3A, transistors 301-310 and resistor 312 are interconnected as a differential amplifier and function as buffer 102 of FIG. 1. The squelch input signal Vin, is connected to the non-inverting input of the differential amplifier at terminal T1. The output of the differential amplifier at the collector of transistor 310 is coupled back to the inverting input at the base of transistor 307. The base of transistor 305 acts as an enable input to the differential amplifier. Capacitor C is coupled to terminal T2. Capacitor C is preferably 2.2 micro-Farads and resistor R is preferably 180K Ohms. Resistor 312 is preferably 45K Ohms.

Transistors 314-332 are interconnected as a voltage comparator and function as first comparator 104 of FIG. 1. The inverting input of the comparator is at the base of transistor 314, the non-inverting input is at the base of transistor 324, and the output of the comparator is at terminal T3.

Transistors 334-335 and resistor 336 function as a current source which supplies bias current to the base of transistors 320 and 338. Transistors 338-344 function as a current enable circuit which couples the output of the second comparator 106 at terminal T5 to the enable input of the buffer at the base of transistor 305. This current enable circuit also couples the output of comparator 106 to the input of the reference voltage source at the base of transistor 346.

Transistor 346, and resistors 347 and 348 function as the reference voltage circuit 108 of FIG. 1. Resistors 336, 347 and 348 are preferably 210K, 110K and 140K Ohm resistors, respectively. The reference voltage is established at the junction of resistors 347 and 348, and is approximately 3.9 Volts when transistor 346 is switched off (Vref1). When transistor 346 is switched on, the reference voltage is at Vcc or approximately 5.0 Volts (Vref2).

Referring to FIG. 3B, transistors 401-417 and resistors 418-420 are interconnected as a voltage comparator and function as voltage comparator 106 of FIG. 1. The inverting input of the voltage comparator is at terminal T1 and the non-inverting input is at terminal T6. Unlike comparator 106 of FIG. 1, there are three outputs of the actual comparator; specifically, the collectors of transistors 414 and 415 and terminal T5. Resistors 418-420 are preferably 81K, 225K and 126K Ohms.

Transistors 422-424 and resistors 425-434 are interconnected as a feedback circuit between the outputs of the comparator at the collectors of transistors 414 and 415 and the non-inverting input of the comparator at terminal T6 and functions as feedback circuit 110 of FIG. 1. Resistors 425-434 are preferably 67K, 180K, 80K, 10K, 81K, 80K, 88K, 80K, 10K and 20K Ohm resistors. When the squelch input signal at terminal T1 is below the first threshold voltage, no current is sourced from the collectors of transistors 414-415 and, consequently, transistors 422 and 423 are switched off. As a result, the voltage at terminal T6, which is the non-inverting input of the comparator, is established by resistors 425, 426 and 431 and with VCC at 5 Volts, the voltage at terminal T6 will be approximately 4.0 Volts. When the squelch input signal of terminal T1 is above 4.0 Volts, the collectors of transistors 414 and 415 source current to the bases of transistors 422 and 423 thereby causing their collectors to saturate. Thus, the collectors of transistors 422 and 423 are pulled to ground and resistors 427-430 lower the voltage at terminal T6 to approximately 3.8 Volts. The output of feedback control circuit 112 is connected to terminal T7 which is connected to the base of the transistor 436. When the output of the feedback control circuit is high, transistor 436 saturates pulling its collector to ground, thereby switching transistor 423 off. With transistor 423 switched off, the voltage at terminal T6 is determined by resistors 425, 426, 427, 428 and 431, and will be approximately 3.9 Volts. Terminal T8 is a test point.

Referring to FIG. 3C, transistors 501-508 are interconnected as the first voltage comparator of feedback control circuit 112, while transistors 512-518 are interconnected as the second voltage comparator. Transistors 509-511 establish a reference voltage of approximately 3.6 Volts at the base of transistor 505, which is the non-inverting input of the first comparator. The inverting input of the first comparator is at the base of transistor 501 which is connected to the output of the buffer. Due to an extra diode drop at the inverting input of the first comparator, the voltage at terminal T2 must be below approximately 4.3 Volts before the output at the collector of transistor 508 sources current to transistor 512.

In the second comparator, the non-inverting input at the base of transistor 515 is also connected to the output of the buffer at terminal T2. The inverting input of the second comparator of the feedback control circuit is connected to a non-illustrated resistive voltage divider which supplies approximately 4.0 Volts to terminal T9. Thus, when the voltage at the output of the buffer (terminal T2) is between 4.0 and 4.3 Volts, the feedback control circuit outputs a current at terminal T7 which, in turn, switches the variable hysteresis feedback circuit such that the threshold voltage is switched from Vth2 to Vth3. Terminals labeled I1 and I2 in FIGS. 3A-3C are connected to current sources which respectively supply 0.01 and 0.05 microamps to each of the terminals so marked.

I claim as my invention:

1. A squelch circuit for a radio receiver, said squelch circuit comprising in combination:

a buffer, the input of said buffer connecting to a squelch input signal, said squelch input signal having a magnitude indicative of the signal strength of a received radio signal, the signal at the output of said buffer being a voltage proportional to said squelch input signal when said buffer is enabled, said output of said buffer being in a high impedance mode when said buffer is disabled;

a timing circuit having a capacitor coupled to said output of said buffer, means for discharging said capacitor and means for isolating said squelch input signal from said timing circuit, when said buffer is disabled;

a first comparator, a first input of said first comparator being coupled to said output of said buffer;

a second comparator, a first input of said second comparator being coupled to said input of said buffer, the output of said comparator switching from a first state to a second state when said squelch input signal crosses a first predetermined threshold, said output of said second comparator being coupled to an enable input of said buffer, such that said buffer is enabled when said output of said second comparator is in said second state;

reference voltage means for establishing a first reference voltage at a second input of said first comparator when said output of said second comparator is in said first state, and for establishing a second reference voltage at said second input of said first comparator when said output of said second comparator is in said second state; and a hysteresis feedback circuit coupled between said output and a second input of said second comparator, such that said output of said second comparator switches from said second state to said first state when said squelch input signal crosses a second predetermined threshold, so that said second comparator has a first predetermined hysteresis.

2. The squelch circuit of claim 1, further comprising:
means for varying the feedback of said hysteresis feedback circuit, such that said second comparator has a second predetermined hysteresis if said squelch input signal is above a predetermined trigger level.

3. A squelch circuit for a radio receiver, said squelch circuit comprising in combination:
a comparator, a first input of said comparator for connection to a squelch input signal, the magnitude of said squelch input signal being indicative of the signal strength of a received radio signal;

a hysteresis feedback circuit coupled between the output and a second input of said comparator;

a buffer which couples when enabled and uncouples when disabled, a timing circuit located at the output of said buffer from the squelch input signal and from the input of the comparator; and means for varying the feedback coupled between the output of the buffer and an input of said hysteresis feedback circuit, such that said comparator has a first predetermined hysteresis if said squelch input signal is below a predetermined trigger level, and a second predetermined hysteresis if said squelch input signal is above said predetermined trigger level.

4. A squelch circuit for a receiver, said squelch circuit comprising:
a buffer, the input of said buffer for connection to a squelch input signal, the magnitude of said squelch input signal being indicative of the signal strength of a received radio signal, the signal at the output of said buffer being a voltage proportional to said squelch input signal when said buffer is enabled, said output of said buffer being in a high impedance mode when said buffer is disabled;

a timing circuit coupled to the output of said buffer which can be uncoupled from the squelch input signal when said buffer is disabled;

a first comparator, a first input of said first comparator being coupled to said output of said buffer;

a second comparator, a first input of said second comparator being coupled to said input of said buffer, the output of said comparator switching from a first state to a second state when said squelch input signal crosses a first predetermined threshold, said output of said second comparator being coupled to an enable input of said buffer, such that said buffer is enabled when said output of said second comparator is in said second state;

reference voltage means for establishing a first reference voltage at a second input of said first comparator when said output of said second comparator is in said first state, and for establishing a second reference voltage at said second input of said first comparator when said output of said second comparator is in said second state; and a hysteresis feedback circuit coupled between said output and a second input of said second comparator, such that said output of said second comparator switches from said second state to said first state when said squelch input signal crosses a second predetermined threshold, so that said second comparator has a first predetermined hysteresis.

5. The squelch circuit of claim 4, further comprising: means for varying the feedback of said hysteresis feedback circuit, such that said second comparator has a second predetermined hysteresis if said squelch input signal is above a predetermined trigger level.

* * * * *